US008637877B2

(12) United States Patent  (10) Patent No.: US 8,637,877 B2
Negley  (45) Date of Patent: Jan. 28, 2014

(54) REMOTE PHOSPHOR LIGHT EMITTING DEVICES

(75) Inventor: Gerald H. Negley, Durham, NC (US)

(73) Assignee: Cree, Inc., Durham, NC (US)

( * ) Notice: Subject to any disclaimer, the term of this patent is extended or adjusted under 35 U.S.C. 154(b) by 245 days.

(21) Appl. No.: 13/101,674

(22) Filed: May 5, 2011

(65) Prior Publication Data

US 2012/0280256 A1  Nov. 8, 2012

(51) Int. Cl.
*H01L 33/00* (2010.01)
(52) U.S. Cl.
USPC .................. 257/88; 257/89; 257/98; 362/235
(58) Field of Classification Search
None
See application file for complete search history.

(56) References Cited

U.S. PATENT DOCUMENTS

| 6,950,193 B1 | 9/2005 | Discenzo |
| 7,858,403 B2 | 12/2010 | Hiller et al. |
| 2009/0072263 A1 | 3/2009 | Paolini et al. |
| 2011/0089455 A1 | 4/2011 | Diana et al. |
| 2012/0048511 A1* | 3/2012 | Moshtagh .................... 165/80.2 |

OTHER PUBLICATIONS

International Search Report Corresponding to International Application No. PCT/US12/35813; Date of Mailing: Aug. 27, 2012; 10 Pages.

* cited by examiner

*Primary Examiner* — Thien F Tran
(74) *Attorney, Agent, or Firm* — Myers Bigel Sibley & Sajovec, P.A.

(57) ABSTRACT

A substrate including phosphor is remotely illuminated by an LED. Optical radiation that emerges through the substrate is measured. Portions of the substrate, such as raised features on the substrate, are then selectively removed responsive to the measuring, so as to obtain a desired optical radiation. In removing portions of the substrate, holes may be drilled through the substrate to provide a separate path for light from the LED that does not pass through the phosphor. Alternatively, a separate LED may be provided outside the dome.

24 Claims, 4 Drawing Sheets

REMOTE PHOSPHOR LIGHT EMITTING DEVICES

BACKGROUND

Various embodiments described herein relate to light emitting devices and, more particularly, to solid state light emitting devices that include luminophoric layers thereon.

Light emitting diodes ("LEDs") are well known solid state light emitting sources that are capable of generating light. LEDs generally include a plurality of semiconductor layers that may be epitaxially grown on a semiconductor or non-semiconductor substrate such as, for example, sapphire, silicon, silicon carbide, gallium nitride or gallium arsenide substrates. One or more semiconductor p-n junctions are formed in these epitaxial layers. When a sufficient voltage is applied across the p-n junction, electrons in the n-type semiconductor layers and holes in the p-type semiconductor layers flow toward the p-n junction. As the electrons and holes flow toward each other, some of the electrons will "collide" with a hole and recombine. When this occurs, a photon of light is emitted, to generate light. The wavelength distribution of the light generated by an LED generally depends on the semiconductor materials used and the structure of the thin epitaxial layers that make up the "active region" of the device (i.e., the area where the electrons and holes recombine).

LEDs typically have a narrow wavelength distribution that is tightly centered about a "peak" wavelength (i.e., the single wavelength where the radiometric emission spectrum of the LED reaches its maximum as detected by a photo-detector). For example, the spectral power distributions of a typical LED may have a full width of, for example, about 10-30 nm, where the width is measured at half the maximum illumination (referred to as the full width half maximum or "FWHM" width). Accordingly, LEDs are often identified by their "peak" wavelength or, alternatively, by their "dominant" wavelength. The dominant wavelength of an LED is the wavelength of monochromatic light that has the same apparent color as the light emitted by the LED as perceived by the human eye. Thus, the dominant wavelength differs from the peak wavelength in that the dominant wavelength takes into account the sensitivity of the human eye to different wavelengths of light.

As most LEDs are almost monochromatic light sources that appear to emit light having a single color, LED lamps that include multiple LEDs that emit light of different colors have been used in order to provide solid state light emitting devices that generate white light. In these devices, the different colors of light emitted by the individual LEDs combine to produce a desired intensity and/or color of white light. For example, by simultaneously energizing red, green and blue light emitting LEDs, the resulting combined light may appear white, or nearly white, depending on the relative intensities of the source red, green and blue LEDs.

White light may also be produced by surrounding a single-color LED with a luminophoric material, such as phosphor, that converts some of the light emitted by the LED to light of other colors by performing wavelength conversion. The combination of the light emitted by the single-color LED that passes through the luminophoric material along with the light of different colors that is emitted by the luminophoric material may produce a white or near-white light. For example, a single blue-emitting LED (e.g., made of indium gallium nitride and/or gallium nitride) may be used in combination with a yellow phosphor, polymer or dye such as for example, cerium-doped yttrium aluminum garnet (which has the chemical formula $Y_3Al_5O_{12}$:Ce, and is commonly referred to as "YAG:Ce"), that "down-converts" the wavelength of some of the blue light emitted by the LED, changing its color to yellow. Blue LEDs made from indium gallium nitride can exhibit high efficiency (e.g., external quantum efficiency as high as 60%). In a blue LED/yellow phosphor device, the blue LED chip produces an emission with a dominant wavelength of about 450-460 nanometers, and the phosphor produces yellow fluorescence with a peak wavelength of about 550 nanometers in response to the blue emission. Some of the blue light passes through the phosphor (and/or between the phosphor particles) without being down-converted, while a substantial portion of the light is absorbed by the phosphor, which becomes excited and emits yellow light (i.e., the blue light is down-converted to yellow light). The combination of blue light and yellow light may appear white to an observer. Such light is typically perceived as being cool white in color. In another approach, light from a violet or ultraviolet emitting LED may be converted to white light by surrounding the LED with multicolor phosphors or dyes. In either case, red-emitting phosphor particles (e.g., a CaAlSiN3 ("CASN") based phosphor) may also be added to improve the color rendering properties of the light, i.e., to make the light appear more "warm," particularly when the single color LED emits blue or ultraviolet light.

As noted above, phosphors are one known class of luminophoric materials. A phosphor may refer to any material that absorbs light at one wavelength and re-emits light at a different wavelength in the visible spectrum, regardless of the delay between absorption and re-emission and regardless of the wavelengths involved. Accordingly, the term "phosphor" may be used herein to refer to materials that are sometimes called fluorescent and/or phosphorescent. In general, phosphors may absorb light having first wavelengths and re-emit light having second wavelengths that are different from the first wavelengths. For example, "down-conversion" phosphors may absorb light having shorter wavelengths and re-emit light having longer wavelengths.

LEDs are used in a host of applications including, for example, backlighting for liquid crystal displays, indicator lights, automotive headlights, flashlights, specialty lighting applications and as replacements for conventional incandescent and/or fluorescent lighting in general lighting and illumination applications.

SUMMARY

A light emitting apparatus may be fabricated, according to various embodiments described herein, by providing a substrate having luminophoric material therein and/or thereon, and remotely illuminating the substrate using a light emitting device that is spaced apart from the substrate. Optical radiation that emerges through the substrate when it is remotely illuminated by the light emitting device is measured. Portions of the substrate are then selectively removed responsive to the measuring, so as to obtain a desired optical radiation that emerges through the substrate when it is remotely illuminated by a light emitting device that is spaced apart from the substrate. The total amount of optical radiation and/or the spatial distribution of the optical radiation may be measured, and selective removing may be performed to obtain a desired total amount of optical radiation and/or a desired spatial distribution of optical radiation. Moreover, the above described operations may be repeatedly performed until a desired optical radiation is obtained. At least one machine may be provided that is configured to perform the fabrication described above.

In some embodiments, the substrate includes raised features and at least some of the raised features are selectively removed responsive to the measuring, so as to obtain a desired optical radiation. The raised features may comprise bumps and/or lines on the inner or outer surface of the substrate and, in some embodiments, these raised features are transparent. In some embodiments, the luminophoric material is on the raised features and at least a portion of the raised features are removed responsive to the measuring, so as to remove at least some of the luminophoric material that is on the raised features. In still other embodiments, the portions of the substrate are selectively removed by forming an array of holes in the substrate that extend at least partially through the substrate. Moreover, in yet other embodiments, the raised features described herein may be used with a phosphor layer that is not remote from the light emitting device, i.e., a phosphor layer that is not spaced apart from the light emitting device.

In other embodiments, a light emitting apparatus is fabricated by providing a dome having phosphor therein and/or thereon, and remotely illuminating the dome using an LED that is located at the base of the dome and spaced apart from a surface of the dome. The light that emerges through the dome when it is remotely illuminated by the LED is measured. Portions of the dome are then selectively removed responsive to the measuring, so as to obtain a desired light that emerges through the dome when it is remotely illuminated by an LED. In some embodiments, raised features are provided on the outer surface of the dome and at least some of the raised features are selectively removed in response to the measuring, so as to obtain a desired light. The raised features may be transparent and may include bumps and/or lines on the outer surface. In some embodiments, the phosphor is on the outer surface of the dome and on the raised features, and at least a portion of the raised features are removed responsive to the measuring, so as to remove at least some of the phosphor that is on the raised features. In other embodiments, an array of holes is formed that extends at least partially through the dome in order to provide the selective removal.

Transmissive optical elements according to various embodiments described herein may include a transparent substrate having luminophoric material therein and/or thereon, and that is configured to be remotely illuminated by a light emitting device that is spaced apart from the transparent substrate. The transparent substrate also includes raised transparent features thereon. The raised transparent features may include transparent bumps and/or lines on the outer surface of the transparent substrate, which may be a dome.

Transmissive optical elements according to other embodiments described herein comprise a transparent substrate having luminophoric material therein and/or thereon, and that is configured to be remotely illuminated by a light emitting device that is spaced apart from the transparent substrate. The transparent substrate further includes an array of holes that extend at least partially through the substrate. The substrate may comprise a dome and the holes may be nonuniformly spaced apart on the dome.

Finally, a light emitting apparatus according to various embodiments described herein includes a mounting substrate, a dome having phosphor therein and/or thereon on the mounting substrate, and a first LED on the mounting substrate inside the dome. A second LED is provided on the mounting substrate outside the dome. A bulb surrounds the dome and the second LED. The dome may include raised features thereon and/or an array of holes that extend at least partially through the dome. Moreover, the first and second LEDs may emit a same color. For example, the first and second LEDs may be blue LEDs and the phosphor may be yellow phosphor.

DETAILED DESCRIPTION

Figure 1:
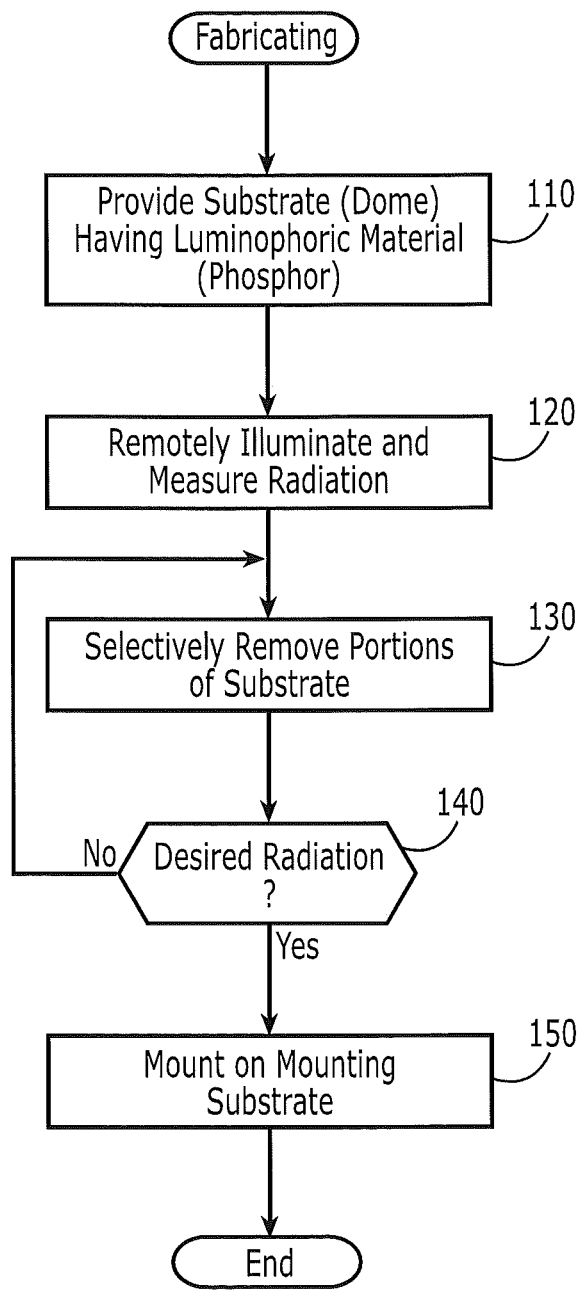
FIG. 1 is a flowchart of operations that may be performed to fabricate a light emitting apparatus according to various embodiments described herein.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that, when used in this specification, the terms "comprises" and/or "including" and derivatives thereof, specify the presence of stated features, operations, elements, and/or components, but do not preclude the presence or addition of one or more other features, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions and/or layers, these elements, components, regions and/or layers should not be limited by these terms. These terms are only used to distinguish one element, component, region or layer from another element, component, region or layer. Thus, a first element, component, region or layer discussed below could be termed a second element, component, region or layer without departing from the teachings of the present invention.

Embodiments of the invention are described herein with reference to cross-sectional and/or other illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention, unless otherwise defined herein. Moreover, all numerical quantities described herein are approximate and should not be deemed to be exact unless so stated.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower" can, therefore, encompass both an orientation of "lower" and "upper," depending on the particular orientation of the figure.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

As used herein, the term "solid state light emitting device" may include a light emitting diode, laser diode and/or other semiconductor device which includes one or more semiconductor layers, which may include silicon, silicon carbide, gallium nitride and/or other semiconductor materials, an optional substrate which may include sapphire, silicon, silicon carbide and/or other microelectronic substrates, and one or more contact layers which may include metal and/or other conductive materials. The design and fabrication of solid state light emitting devices are well known to those skilled in the art. The expression "light emitting device," as used herein, is not limited, except that it be a device that is capable of emitting light. As used herein, a layer or region is considered to be "transparent" when at least some of the radiation that impinges on the transparent layer or region emerges through the transparent layer or region. Moreover, the term "phosphor" is used synonymously for any wavelength conversion material(s).

Some embodiments described herein can use gallium nitride (GaN)-based LEDs on silicon carbide (SiC)-based substrates. However, it will be understood by those having skill in the art that other embodiments of the present invention may be based on a variety of different combinations of substrate and epitaxial layers. For example, combinations can include AlGaInP LEDs on GaP substrates; InGaAs LEDs on GaAs substrates; AlGaAs LEDs on GaAs substrates; SiC LEDs on SiC or sapphire ($Al_2O_3$) substrates and/or Group III-nitride-based LEDs on gallium nitride, silicon carbide, aluminum nitride, sapphire, zinc oxide and/or other substrates. Moreover, in other embodiments, a substrate may not be present in the finished product. In some embodiments, the LEDs may be gallium nitride-based LED devices manufactured and sold by Cree, Inc. of Durham, N.C., and described generally at cree.com.

Various embodiments described herein may arise from recognition that remote phosphor configurations, wherein a remote phosphor substrate having luminophoric material therein and/or thereon is remotely spaced from a light emitting device such as an LED, are increasingly being used in light emitting apparatus. However, it is difficult to obtain a desired color point and/or spatial distribution of radiation that emerges from the remote phosphor substrate. Various embodiments described herein can provide selective removal of portions of the remote phosphor substrate, in response to measurement of light when the remote phosphor substrate is remotely illuminated by a light emitting device. Moreover, raised features may be provided on the remote phosphor substrate that can facilitate the selective removal of portions of the remote phosphor substrate responsive to the measuring and/or an array of holes may be formed in the remote phosphor substrate as part of the selective removal. Finally, in order to facilitate control of the color point and/or spatial distribution of light, a path may be provided in the light emitting apparatus wherein in some of the light passes through the phosphor, but other light does not pass through the phosphor.

FIG. 1 is a flowchart of operations that may be performed to fabricate a light emitting apparatus according to various embodiments described herein. These operations may be performed by at least one machine that is configured to fabricate a light emitting apparatus, as will be described in detail herein.

Referring now to FIG. 1, at Block 110, a substrate, such as a dome, is provided having luminophoric material, such as phosphor, therein and/or thereon. Various configurations of substrates will be described in detail in connection with FIG. 2. In some embodiments, the substrate is a flat or planar substrate. In other embodiments, the substrate is non-planar. In still other embodiments, the substrate may be in the form of a shell and, in yet other embodiments, the substrate may be in the form of a dome. The substrate may be fabricated from glass and/or plastic in some embodiments. The substrate may include luminophoric material, such as phosphor, therein and/or thereon. In some embodiments, the substrate includes a coating of phosphor on the outer surface thereof.

Figure 3:
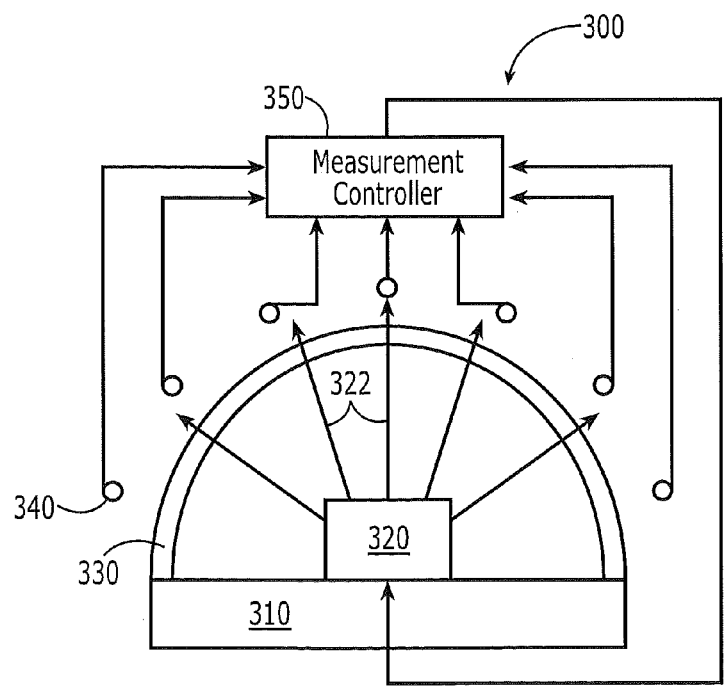
FIG. 3 is a schematic diagram of a machine that may be used to remotely illuminate and measure radiation pursuant to Block 120 of FIG. 1 according to various embodiments described herein.

Still referring to FIG. 1, at Block 120, the substrate is remotely illuminated using a light emitting device that is spaced apart from the substrate, and optical radiation that emerges through the substrate when it is remotely illuminated by the light emitting device that is spaced apart from the substrate is measured. FIG. 3 illustrates an apparatus that can be configured to remotely illuminate the substrate and to measure the radiation that emerges therethrough, as will be described in detail below.

Figure 4:
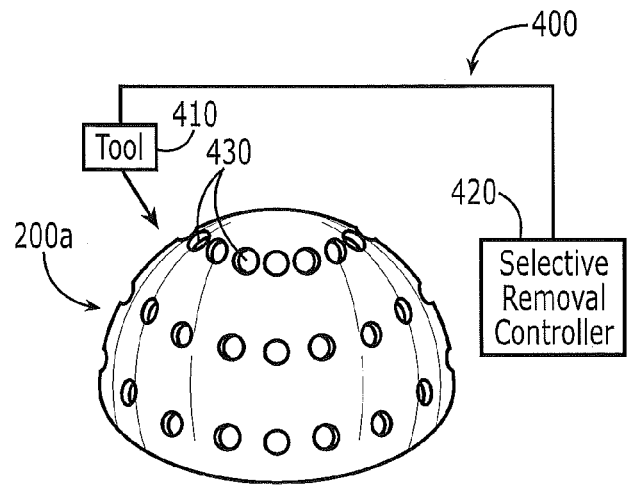
FIG. 4 is a schematic diagram of a machine that may be used to selectively remove portions of a substrate pursuant to Block 130 of FIG. 1 according to various embodiments described herein.

Referring again to FIG. 1, at Block 130, portions of the substrate are selectively removed responsive to the measuring. FIG. 4 illustrates a machine that may be configured to selectively remove portions of the substrate as will be described in detail below. In some embodiments, after selective removal, no further measurements need be performed. FIG. 5 illustrates various substrates from which portions thereof have been selectively removed according to various embodiments described herein, as will be described in detail below. In other embodiments, at Block 140, measurement again may be performed to determine whether a desired radiation (total amount of optical radiation including, for example, a desired color point and/or a spatial distribution of the optical radiation) is obtained. If not, then selective removal at Block 130 may again be performed until the desired radiation is obtained at Block 140.

Figure 6:
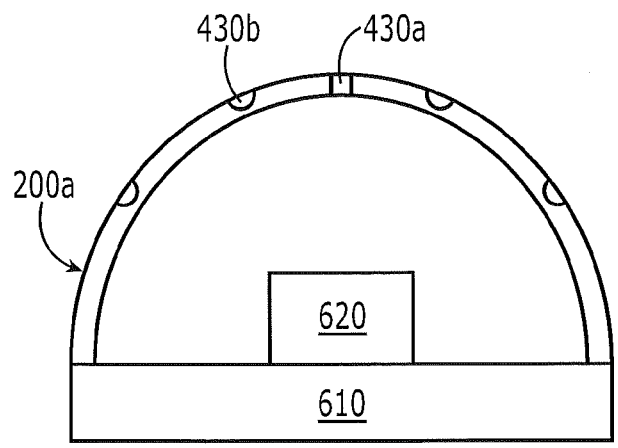
FIG. 6 is a cross-sectional view of a substrate such as a dome and an LED that are on a mounting substrate, pursuant to Block 150 of FIG. 1 according to various embodiments described herein.

Finally, at Block 150, the substrate, such as a dome, and an LED, which may or may not be the LED that is used to remotely illuminate at Block 120, are mounted on a mounting substrate, such as a submount, to provide a light emitting apparatus. FIG. 6 illustrates a transmissive optical element, such as a dome, and a light emitting device, such as an LED, mounted on a mounting substrate pursuant to operations of Block 150.

Operations of FIG. 1 will now be described more fully with reference to FIGS. 2-6.

FIGS. 2A-2D are perspective views of substrates, embodied as domes, that may be provided according to Block 110 of FIG. 1. As shown in FIGS. 2A-2D, these substrates may comprise a dome having a phosphor dispersed therein and/or coated on the inner and/or outer surfaces thereof. In some embodiments, the dome may be about 1" in diameter and about 1" in height. It will also be understood that, as used herein, a "dome" refers to a structure having a generally arcuate surface profile, including regular hemispherical structures as well as other generally arcuate structures that do not form a regular hemisphere, which are eccentric in shape and/or have other features, structures and/or surfaces.

Figure 2A:
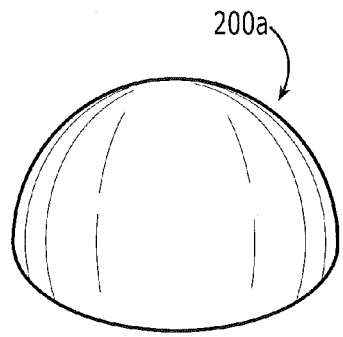
FIGS. 2A-2D, collectively referred to herein as FIG. 2, are perspective views of various substrates, such as domes, that may be provided in Block 110 of FIG. 1 according to various embodiments described herein.
Figure 2B:
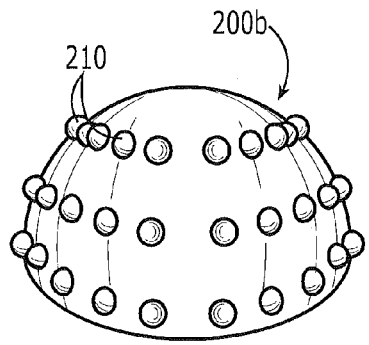
Figure 2C:
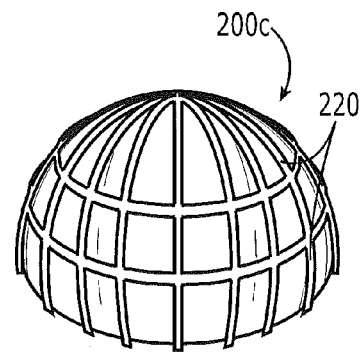

In FIG. 2A, the dome 200a has flat inner and outer surfaces. In contrast, the dome 200b of FIG. 2B and dome 200c of FIG. 2C include raised features thereon. In FIG. 2B, the raised features comprise an array of bumps or dimples 210 that are dispersed over the outer surface of the dome 200b. In FIG. 2C, the raised features comprise a series of lines 220 that may extend in orthogonal directions (which may correspond to latitude and longitude lines) on the outer surface of the dome 200c. Combinations of raised bumps 210 and raised lines 220 may be provided along with other raised features. Moreover, the raised features may also be provided in the inner surface of the dome, as well.

The raised features may be used to facilitate selective removal of portions of the substrate by facilitating selective removal of the raised features in order to obtain a desired optical radiation in response to measurement. Stated differently, when the substrate, such as the dome 200a, is smooth, it may be difficult to selectively remove portions of the substrate in a controlled manner. In contrast, when raised features 210/220 are provided, it may be easier to grind away at least portions of these raised features in a controlled manner.

Figure 2D:
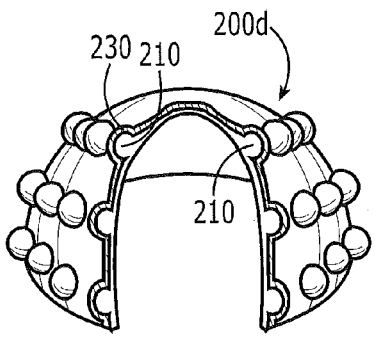

In FIGS. 2A-2C, the substrates are transparent, so that at least some of the radiation that impinges on the substrate emerges through the substrate. It will be understood, however, that various opaque regions may also be provided on the substrate. Similarly, the raised features 210/220 may also be transparent. In any of the embodiments of FIGS. 2A-2C, the phosphor may be dispersed within the substrate and/or may be provided as a coating on the substrate including on the raised features 210/220 of FIGS. 2B/2C. Thus, for example, FIG. 2D illustrates the dome of FIG. 2B, wherein a coating of phosphor 230 is provided on the outside of the dome 200b including on the raised features 230. In some of these embodiments, phosphor may not be dispersed within the dome 200b itself. It will also be understood that a phosphor coating may be provided on the outer surface of a dome 200c having an array of lines and/or other raised surfaces.

Accordingly, FIGS. 2B-2D illustrate transmissive optical elements 200b/200c according to various embodiments described herein including a transparent substrate having luminophoric material therein and/or thereon, and configured to be remotely illuminated by a light emitting device that is spaced apart from the transparent substrate. The transparent substrate further includes raised transparent features 210/220 therein and/or thereon.

FIG. 3 is a schematic diagram of a machine 300 that may be configured to remotely illuminate a substrate using a light emitting device that is spaced apart from the substrate, and to measure optical radiation that emerges through the substrate when it is remotely illuminated by the light emitting device that is spaced apart from the substrate, as was described, for example, in connection with Block 120 of FIG. 1. The spatial distribution of the light, as well as the integrated light output, can be measured.

More specifically, referring to FIG. 3, a light emitting device such as an LED 320 is mounted on a substrate 310. A substrate having luminophoric material therein/thereon 330, also referred to herein as a "luminophoric substrate" 330, is also mounted on the substrate 310. The luminophoric substrate 330 may be configured as was described in Block 110 of FIG. 1 and, more specifically, may comprise a dome according to the embodiments described above in FIG. 2. The LED 320 is located at the base of the dome 330 and spaced apart from the surface of the dome. A plurality of optical sensors 340 may be provided outside the luminophoric substrate 330 to sense the optical radiation 322 from the LED 320. A measurement controller 350 is provided that is configured to energize the LED 320 to remotely illuminate the luminophoric substrate 330 and to measure the radiation that is sensed by the sensors 340.

In some embodiments, the substrate 310 may be a test substrate and the LED 320 may be a test LED that is used to perform the measurements of FIG. 3 and Block 120. In this case, the machine 300 may be configured to provide successive picking and placing of successive luminophoric substrates 330 onto the substrate 320 having the LED 320 thereon, and removal of the luminophoric substrate 330 after measurements take place. In these embodiments, the LED 320 may be configured to have light emission characteristics which closely match those of the LEDs that will eventually be mated with the luminophoric substrate 330 after measurement and selective removal. Thus, in some embodiments, the machine 300 may operate using a test substrate and a test LED to sequentially measure and test a plurality of luminophoric substrates prior to their packaging. However, in other embodiments, the substrate 310 and the LED 320 may be the actual mounting substrate and the actual LED that are to be mated with the actual luminophoric substrate 300 to produce a packaged light emitting apparatus. In other words, the machine 300 may also operate on packaged LEDs.

FIG. 4 is a schematic diagram of a machine 400 that may be used to selectively remove portions of the substrate, for example, pursuant to Block 130 of FIG. 4. Referring to FIG.

4, the machine 400 includes a selective removal tool 410, which may include a grinder, etcher, laser and/or any other apparatus that may be used to selectively remove portions of a substrate in a controlled manner. For example, a lathe may be provided to selectively remove the high spots of the dome and/or a laser may be provided to drill the holes. A selective removal controller 420 may also be provided. The selective removal controller 420 may be separate from or at least partially integrated with the measurement controller 350 of FIG. 3. If separate, measurements may be provided by the measurement controller 320 and translated into instructions for the removal tool 410 to provide selective removal of portions of the substrate responsive to the measuring of FIG. 3.

In FIG. 4, substrate 200a of FIG. 2A is illustrated, and selective removal takes place by forming an array of holes 430 that extend at least partially through the substrate 200a. However, other selective removal techniques may also be employed, as will be described below in connection with FIG. 5.

It will also be understood that selective removing may be performed so as to obtain a desired total or integrated amount of optical radiation having various characteristics, such as a desired color point, and/or a desired spatial distribution of the optical radiation so as to provide angular uniformity and/or a desired angular variation of the optical radiation. Other desired characteristics may be obtained.

FIG. 5 illustrates substrates of FIG. 2 after selective removal of FIG. 4.

Figure 5A:
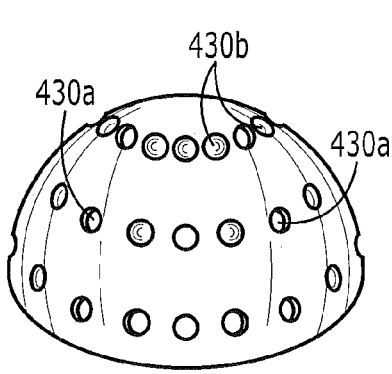
FIGS. 5A-5D, collectively referred to herein as FIG. 5, are perspective views of completed substrates that may be obtained pursuant to Block 140 of FIG. 1 according to various embodiments described herein.

Specifically, FIG. 5A illustrates the substrate 200a of FIG. 2A after an array of holes 430 has been formed therein pursuant to operations of FIG. 4. As shown in FIG. 5A, some of the holes 430a extend through the substrate ("through holes"), whereas other holes 430b may extend partially but not fully through the substrate ("blind holes"). Combinations of through holes 430a and blind holes 430b may be provided in various arrays.

In some embodiments, wherein the dome 200a is on the order of about 1" in height and diameter, the holes may be about 25 µm or less in diameter, and may be spaced apart at about 250 µm or less spacing, so that the light emitted from the holes is not visible in the "far field", for example at distances of at least about 2 cm from the outside surface of the dome.

Figure 5B:
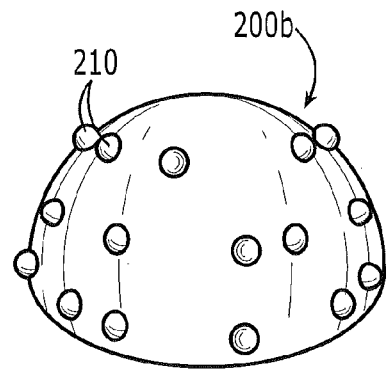

FIG. 5B illustrates the dome 200b of FIG. 2B, wherein at least some of the raised bumps 210 have been removed. It will be understood that FIG. 5B illustrates total removal of some of the raised bumps. In other embodiments, at least some of the bumps may only be partially removed and, in yet other embodiments, all of the bumps may be subject to partial but not full removal.

Figure 5C:
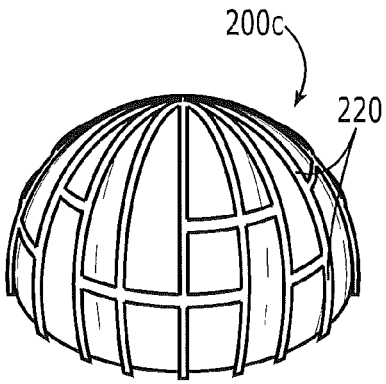

FIG. 5C illustrates domes 200c of FIG. 2C, with at least some of the lines 220 being removed. Longitudinal and/or latitudinal lines may be removed. Moreover, FIG. 5C illustrates at least some of the lines 220 being fully removed. In other embodiments, at least some of the lines may only be partially removed and, in other embodiments, all of the lines may be partially removed.

Figure 5D:
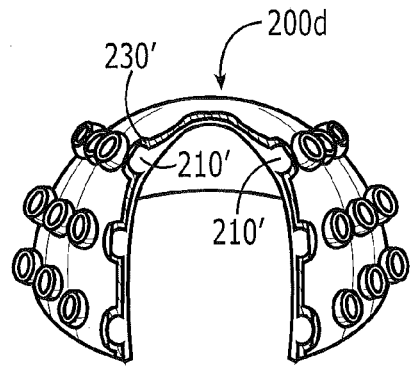

FIG. 5D illustrates embodiments of FIG. 2D wherein the tops of the bumps 210 have been removed to provide flat-top bumps 210' in which the portion of the phosphor layer 230 on the flat top bumps also has been removed, as shown by phosphor layer 230'. A patterned phosphor layer 230' is thereby provided wherein phosphor is not present on the flat part of the bumps 210'. Accordingly, FIG. 5D illustrates embodiments wherein the luminophoric material is on the raised features and wherein selectively removing comprises selectively removing at least a portion of the raised features responsive to the measuring, so as to remove at least some of the luminophoric material that is on the raised features.

FIG. 6 illustrates a light emitting apparatus that has been fabricated as was described, for example, at Block 150 of FIG. 1. As shown, an LED 620 is mounted on a substrate 610 and surrounded by a luminophoric substrate, such as the dome 200a of FIG. 5A. It will be understood that the substrate 610 may be a submount or other mounting substrate that is used for the packaged light emitting apparatus. In other embodiments, the substrate 610 may be the same substrate 310 that was used for testing in FIG. 3. Similarly, the LED 620 may be an LED having similar characteristics as the LED 320 that was used for testing in FIG. 3, but, in other embodiments, the LED 620 may be the same LED 320 that was used in FIG. 3. Finally, the luminophoric substrate 200a of FIG. 5A is illustrated as being mounted on the substrate 610 and surrounding the LED 620. However, substrates of FIGS. 5B, 5C, 5D and/or other embodiments described herein may also be used.

Accordingly, FIG. 6 also illustrates a transmissive optical element according to various embodiments of the present invention that includes a transparent substrate 200a having luminophoric material therein and/or thereon that is configured to be remotely illuminated by a light emitting device that is spaced apart from the transparent substrate 200a. The transparent substrate 200a further includes raised transparent features thereon and/or holes 430a/430b therein that extend at least partially through the transparent substrate. The transmissive optical element is further combined with an LED 620 that is located at the base of the dome and spaced apart from a surface of the dome, and is further combined with a mounting substrate 610, wherein the LED 620 and the dome 200a are on the mounting substrate 610.

Figure 7:
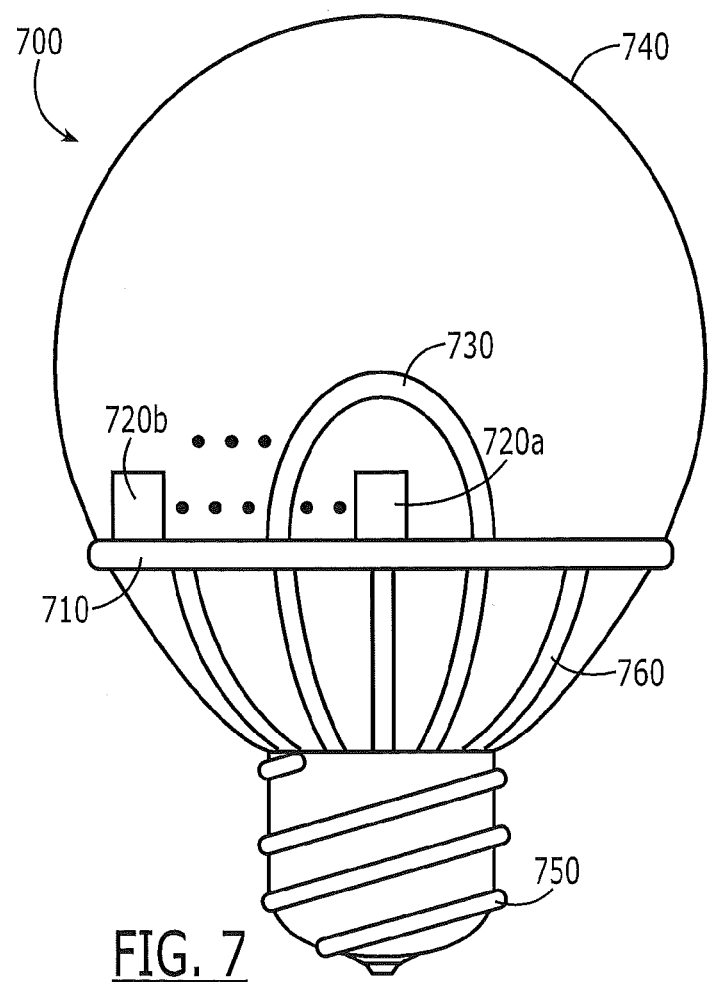
FIG. 7 is a cross-section of a light emitting apparatus according to various other embodiments described herein.

FIG. 7 is a cross-sectional view of a light emitting apparatus according to various other embodiments described herein. As shown in FIG. 7, the light emitting apparatus 700 includes a mounting substrate 710, which may correspond to the mounting substrate 610 of FIG. 6 or 310 of FIG. 3. A dome 730 having phosphor therein and/or thereon is mounted on the mounting substrate 710. The dome 730 may correspond to the domes of FIG. 2 or 5. A first LED 720a is on the mounting substrate 710 inside the dome 730. A second LED 720b is on the mounting substrate 710 outside the dome 730. Finally, a bulb 740 surrounds the dome 730 and the second LED 720b. The bulb may be diffusive. Multiple domes 730, first LEDs 720a and/or second LEDs 720b may also be provided. For example, in some embodiments, on the order of eight or more LEDs 720a may be placed under the dome 730 and one or more LEDs 720b may be placed outside the dome 730. A screw-type or other base 750 and heat sinking 760 may also be provided.

In some embodiments, the dome includes raised features thereon, as was described in connection with FIGS. 2B-2D and 5B-5D, whereas in other embodiments, the dome includes an array of holes that extends at least partially through the dome, as was described in connection with FIG. 5A.

In some embodiments, the first and second LEDs 720a and 720b emit the same color. In some embodiments, the first and second LEDs 720a and 720b are blue LEDs and the phosphor in and/or on the dome 730 is yellow phosphor. Accordingly, embodiments of FIG. 7 provide a separate optical path from the second LED 720b that does not pass through the phosphor in/on the dome 730.

It will also be understood that the raised features that were illustrated in FIGS. 2B-2D and 5B-5D may be used with a phosphor layer that is not remote from the light emitting device, i.e., a phosphor layer that is not spaced apart from the light emitting device. Accordingly, embodiments of FIGS. 1, 3, 4, 6 and 7 that include the raised features of FIGS. 2B-2D and/or FIGS. 5B-5D may be used with phosphor layers that are not remote by providing a layer having luminophoric material therein and/or thereon and having raised features thereon, illuminating the layer using a light emitting device, measuring optical radiation that emerges through the layer when it is illuminated by the light emitting device, and selectively removing at least some of the raised features responsive to the measuring so as obtain a desired optical radiation that emerges through the layer when it is illuminated by the light emitting device.

Additional discussion of various embodiments described herein will now be provided. Specifically, remote phosphor LED light systems are available that utilize a blue LED and a disk or other shaped yellow, green and/or red remote phosphor structure. Remote phosphor systems may allow for higher operating temperatures of the LEDs that drive the remote phosphor and, therefore, may be suitable for use in applications where the ability to dissipate heat may be limited.

One difficulty with remote phosphor systems is providing a consistent color point for the overall system. Conventionally, to provide a white light source from a blue LED and a yellow or green phosphor, some amount of blue light exiting the system is required. Thus, remote phosphor systems typically control the thickness of the phosphor to allow some blue light that is incident on the phosphor to pass through the phosphor. The amount of blue light that escapes the phosphor combines with the yellow or green light from the phosphor to produce light that is perceived as white. However, the ability to control phosphor thickness may be difficult, and there may be differences between the color points of different LED systems.

Conventional techniques for controlling the amount of blue light that escapes the phosphor can provide successive spray coating of phosphors or can grind or otherwise remove phosphor. In either case, however, the color point of the LED system is impacted by the amount of blue light that passes through the phosphor.

Various embodiments that have been described herein in connection with, for example, FIGS. 2B-2D and 5B-5D provide raised features on a luminophoric substrate that can facilitate the controlled removal of phosphor. In other embodiments, as illustrated, for example, in FIG. 5A, a separate path for blue light can be provided that does not pass through the phosphor, for example by providing holes that extend through the remote substrate. Thus, blue light may be totally blocked with phosphor or may only be partially blocked. If all of the blue light is blocked, then the color point may be set by setting a fixed level of blue light that does not pass through the phosphor. If the blue light is only partially blocked by the phosphor, then the blue light that is provided by a separate path may be adjusted based on the amount of blue light that escapes the phosphor.

A separate path for blue light may be provided by physically separating some blue LEDs from the phosphor as was illustrated, for example, in FIG. 7, or by providing a path through the remote phosphor structure whereby the blue light does not pass through the phosphor as was illustrated, for example, in FIGS. 5A and 5D. For example, as illustrated in FIG. 5A, holes, openings or transparent regions of a remote phosphor may be provided to provide a path for the blue light that does not pass through the phosphor region of the phosphor structure. The amount of blue light that does not pass through the phosphor may be tuned by, for example, drilling different quantities and/or sizes of holes through the phosphor structure, as was illustrated in FIG. 5A. The amount of blue light that does not pass through the phosphor may also be tuned by, for example, grinding the tops of the raised features so as to remove the phosphor coating that was thereon, as was illustrated in FIG. 5D. For embodiments where a portion of the blue light is provided by a blue LED 720*b* that is not an excitation source for the phosphor, as was illustrated, for example, in FIG. 7, the amount of light output by the blue LED may be controlled by, for example, varying the level of current and/or duty cycle of current through the blue LED 720*b*.

In such a manner, the amount of blue light that is combined with light from the phosphor may be adjusted independent of the thickness of the phosphor. Moreover, various embodiments have been described herein in terms of subtractive or selective removal of portions of the substrate. However, other embodiments therein may selectively add transparent and/or opaque regions to a remote phosphor substrate. The regions may be bumps, lines and/or other features, as described herein.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A light emitting apparatus comprising:
   a mounting substrate;
   a dome having phosphor therein and/or thereon, on the mounting substrate;
   eight or more first Light Emitting Diodes ("LEDs") on the mounting substrate inside the dome;
   one or more second LEDs on the mounting substrate outside the dome; and
   a bulb that at least partially surrounds the dome and the one or more second LEDs.

2. A light emitting apparatus according to claim 1 wherein the dome includes raised features thereon.

3. A light emitting apparatus according to claim 1 wherein the dome includes an array of holes that extend at least partially through the dome.

4. A light emitting apparatus according to claim 1 wherein the first and second LEDs emit a same color.

5. A light emitting apparatus according to claim 1 wherein the first and second LEDs are blue LEDs and wherein the phosphor is yellow phosphor.

6. A light emitting apparatus according to claim 1 further comprising:
   a base.

7. A light emitting apparatus according to claim 6 wherein the base is a screw-type base.

8. A light emitting apparatus according to claim 6 further comprising a heat sink.

9. A light emitting apparatus according to claim 8 wherein the heat sink extends between the substrate and the base.

10. A light emitting apparatus according to claim 1 wherein the bulb is diffusive.

11. A light emitting apparatus according to claim 1 further comprising a heat sink.

12. A light emitting apparatus according to claim 1 wherein only a single second LED is on the mounting substrate outside the dome.

13. A light emitting apparatus comprising:
a mounting substrate;
a dome having phosphor therein and/or thereon, on the mounting substrate;
eight or more first Light Emitting Diodes ("LEDs") on the mounting substrate inside the dome;
one or more second LEDs on the mounting substrate outside the dome; and
a bulb that encloses the dome and the one or more second LEDs along with a plane that is parallel to the mounting substrate and/or to the first and second LEDs.

14. A light emitting apparatus according to claim 13 wherein the dome includes raised features thereon.

15. A light emitting apparatus according to claim 13 wherein the dome includes an array of holes that extend at least partially through the dome.

16. A light emitting apparatus according to claim 13 wherein the first and second LEDs emit a same color.

17. A light emitting apparatus according to claim 13 wherein the first and second LEDs are blue LEDs and wherein the phosphor is yellow phosphor.

18. A light emitting apparatus according to claim 13 further comprising:
a base.

19. A light emitting apparatus according to claim 18 wherein the base is a screw-type base.

20. A light emitting apparatus according to claim 18 further comprising a heat sink.

21. A light emitting apparatus according to claim 20 wherein the heat sink extends between the substrate and the base.

22. A light emitting apparatus according to claim 13 wherein the bulb is diffusive.

23. A light emitting apparatus according to claim 13 further comprising a heat sink.

24. A light emitting apparatus according to claim 13 wherein only a single second LED is on the mounting substrate outside the dome.

* * * * *